(12) United States Patent
Hronik

(10) Patent No.: US 7,956,693 B1
(45) Date of Patent: Jun. 7, 2011

(54) METHOD AND APPARATUS FOR ADJUSTING PLL AND/OR DLL TIMING OFFSETS

(75) Inventor: Stanley Hronik, Sunnyvale, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 95 days.

(21) Appl. No.: 11/739,546

(22) Filed: Apr. 24, 2007

(51) Int. Cl.
*H03L 7/089* (2006.01)

(52) U.S. Cl. ....... 331/1 A; 331/17; 331/177 R; 327/157; 327/158

(58) Field of Classification Search ............. 331/DIG. 2, 331/1 A, 2, 10, 12, 14, 17–18, 25, 177 R, 331/1 R, 173, 44; 327/147–158, 146, 162, 327/291–299, 129; 375/376; 370/516, 395.62; 708/271

See application file for complete search history.

(56) References Cited

U.S. PATENT DOCUMENTS

| | | | | |
|---|---|---|---|---|
| 5,157,354 A * | 10/1992 | Saiki et al. | ..................... | 331/1 A |
| 5,978,425 A * | 11/1999 | Takla | ............................. | 375/374 |
| 6,043,717 A * | 3/2000 | Kurd | ............................... | 331/17 |
| 6,542,040 B1 * | 4/2003 | Lesea | ............................... | 331/11 |
| 6,608,530 B1 * | 8/2003 | Green et al. | .................... | 331/25 |
| 6,801,028 B2 * | 10/2004 | Kernahan et al. | ............. | 323/283 |
| 6,867,627 B1 * | 3/2005 | Murtagh | ....................... | 327/158 |
| 6,985,705 B2 * | 1/2006 | Shohara | ..................... | 455/164.1 |
| 7,187,220 B1 * | 3/2007 | Alben et al. | .................. | 327/156 |

\* cited by examiner

*Primary Examiner* — James H. Cho
*Assistant Examiner* — Christopher Lo
(74) *Attorney, Agent, or Firm* — Heimlich Law, PC; Alan Heimlich, Esq.

(57) ABSTRACT

A method and apparatus for adjusting PLL and/or DLL timing offsets have been disclosed.

4 Claims, 18 Drawing Sheets

METHOD AND APPARATUS FOR ADJUSTING PLL AND/OR DLL TIMING OFFSETS

RELATED APPLICATION

This application is related to application Ser. No. 11/395,602 filed Mar. 31, 2006 titled "Method and Apparatus for Parameter Adjustment, Testing, and Configuration", which is hereby incorporated herein by reference in its entirety including all incorporated references therein.

FIELD OF THE INVENTION

The present invention pertains to timing offsets. More particularly, the present invention relates to a method and apparatus for adjusting PLL and/or DLL timing offsets.

BACKGROUND OF THE INVENTION

As electronic devices bus widths and bus speeds increase, the components that drive those busses must accommodate ever more accurate timing constraints. The use of PLL (phase locked loop) and/or DLL (delay locked loop) circuits assists in meeting those constraints.

PLL and/or DLL circuits often are used to assist in aligning clocks with respect to other signals (e.g. data, etc.). The offsets (e.g. static offsets) in PLL and/or DLL circuits are fixed and may not allow optimum device (e.g. component) performance. This may present a problem.

BRIEF DESCRIPTION OF THE DRAWINGS

The invention is illustrated by way of example and not limitation in the figures of the accompanying drawings in which.

DETAILED DESCRIPTION

This disclosure discusses methods and apparatuses that may be used with PLLs (phase locked loops), and/or DLLs (delay locked loops) in circuits. Additionally the methods and apparatuses may be used with other types of locked loop devices. Reference to PLL (e.g. in the description, claims, etc.) shall include all such locked loop circuits unless specifically noted otherwise.

In high-speed clocking applications, it may be necessary to adjust the phase of a clock. Possible reasons include, for example, aligning the clock to a data bus for more accurate capture of the bus, adjusting timing within a system, etc. Adjusting the static phase offset of a PLL or DLL or locked loop by using information, for example, from a serial data stream (e.g. JTAG (Joint Test Action Group), I2C (Inter-Integrated Circuit), etc.), a non-volatile memory, register, etc., is disclosed. These techniques provide the ability for software to control clock phases and in some applications may avoid the need for special training or physical adjustment. Adjusting the clock through, for example, a serial data stream may lower the need for complicated circuitry. Additionally, if a device already has some communications capability, for example, a JTAG interface, then it may be easier to implement the techniques disclosed.

In addition to clock positioning for optimum performance, adjusting the clock during testing can check for limit conditions, system configuration changes, and any situation where an operator may not be present or have access to the adjustment. It is possible, for example, to "search" for the optimum clock position during system bring up (e.g. power up, booting, etc.) in some situations where the required clock position is unknown. Operation of the adjustment mechanism does not require a functional system, only the operability of the diagnostic communications link.

Adjustments of the offset may be made during normal system operation without upsetting the device operation. This allows automatic adjustments as environmental or other drift conditions are observed. No down time is needed while a system retrains or requires physical adjustment.

Figure 3:
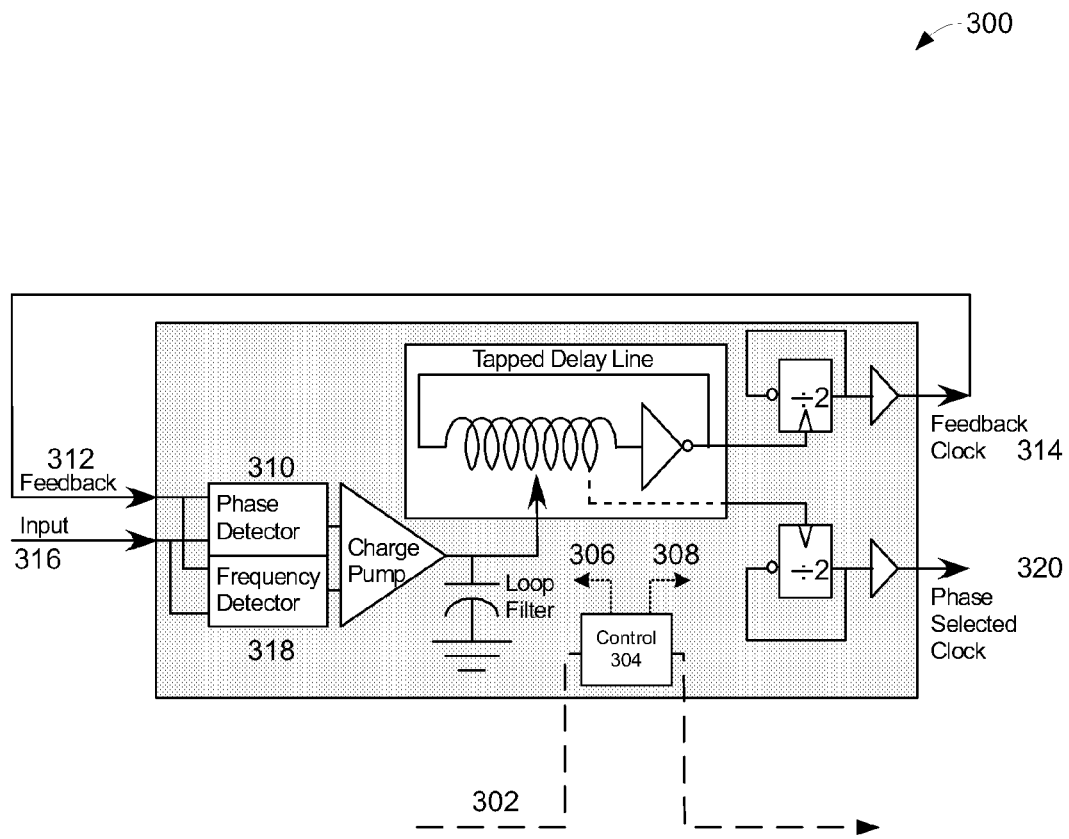
FIG. 3 illustrates one embodiment of the present invention showing a block diagram of a PLL.

In one embodiment of the invention, a serial data chain is used to affect static phase offset. In PLL and DLL devices, there is a need to "lock" the output signal to the input signal. FIG. 3 illustrates, generally at 300, one embodiment of the present invention showing a block diagram of a PLL. The "goal" of the PLL in an application is to "Lock" the output signal to the input signal so there is no phase difference between the two. Within the PLL block diagram is a "Phase Detector" 310 that will compare the feedback signal 312 it is receiving from the output of the PLL 314 with the input signal to the PLL 316. If the two are identical or at "spec", it will make no changes to the output frequency of the PLL. If the two are not in phase, the Phase detector 310 will adjust the output frequency very slightly to start moving the phase towards the alignment point.

In some applications, it is desirable that the output of the PLL be slightly ahead of, or behind, the Input. In other words, it is necessary to adjust the static phase offset of the PLL to something other than zero. Possible applications of this are high speed clocking situations where a designer wants to better align the clock with data.

An example where this variable offset adjustment is of use is in the use of edge-aligned clocks to avoid skew between the clock and data in high-speed applications. This provides the advantage of tighter control on the position of the clock relative to the data so that the data may be more easily captured by a receiver using the clock. Without this adjustment the receiver of the clock and data must capture the data using the clock that may not be properly positioned for a traditional clock/data relationship.

Figure 4:
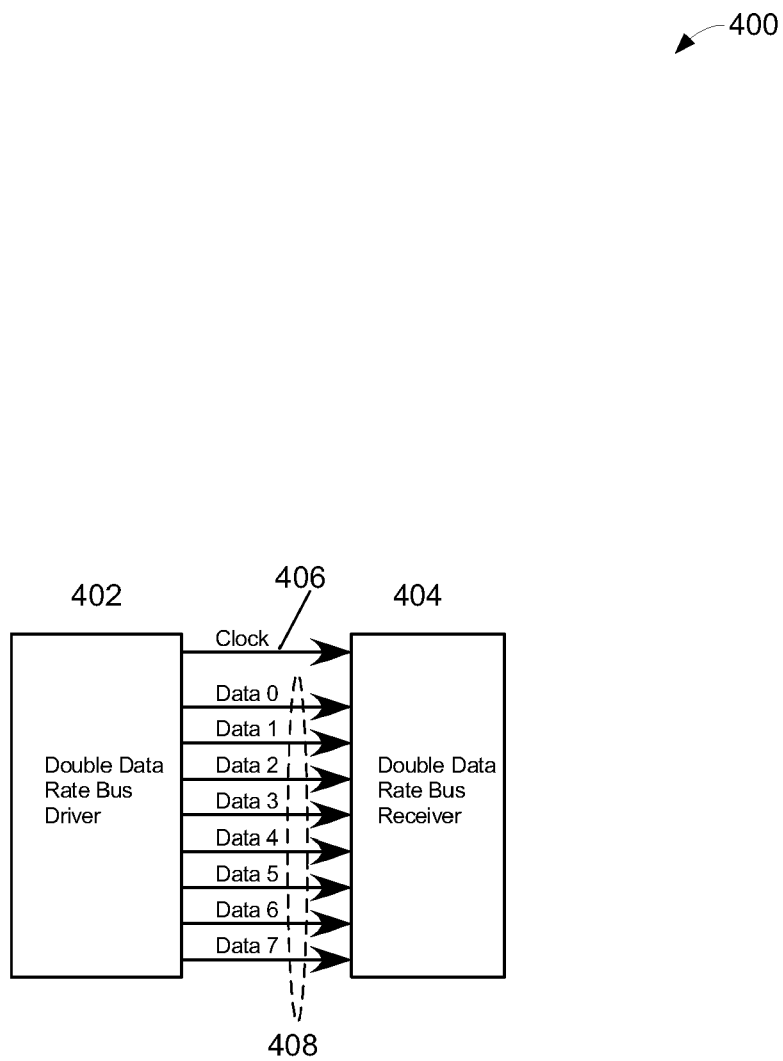
FIG. 4 illustrates a clocked data bus where some embodiments of the present invention may be used.

FIG. 4 illustrates, generally at 400, an example of edge-aligned clocks in a double data rate application in which the present invention may be used. At 402 is a double data rate bus driver, at 404 a double data rate bus receiver, at 406 a clock, and at 408 Data 0-7. A single data rate application would be similar, except the data would be half the frequency. The clock edge is very closely aligned with the data in the example. Accurately clocking the data into a register requires that the receiving device phase shift the clock to align with the most stable portion of the data (e.g. center of the data eye). Usually this requires a 90-degree phase shift in the clock, assuming that the fixed 90-degree position is optimum.

Figure 5:
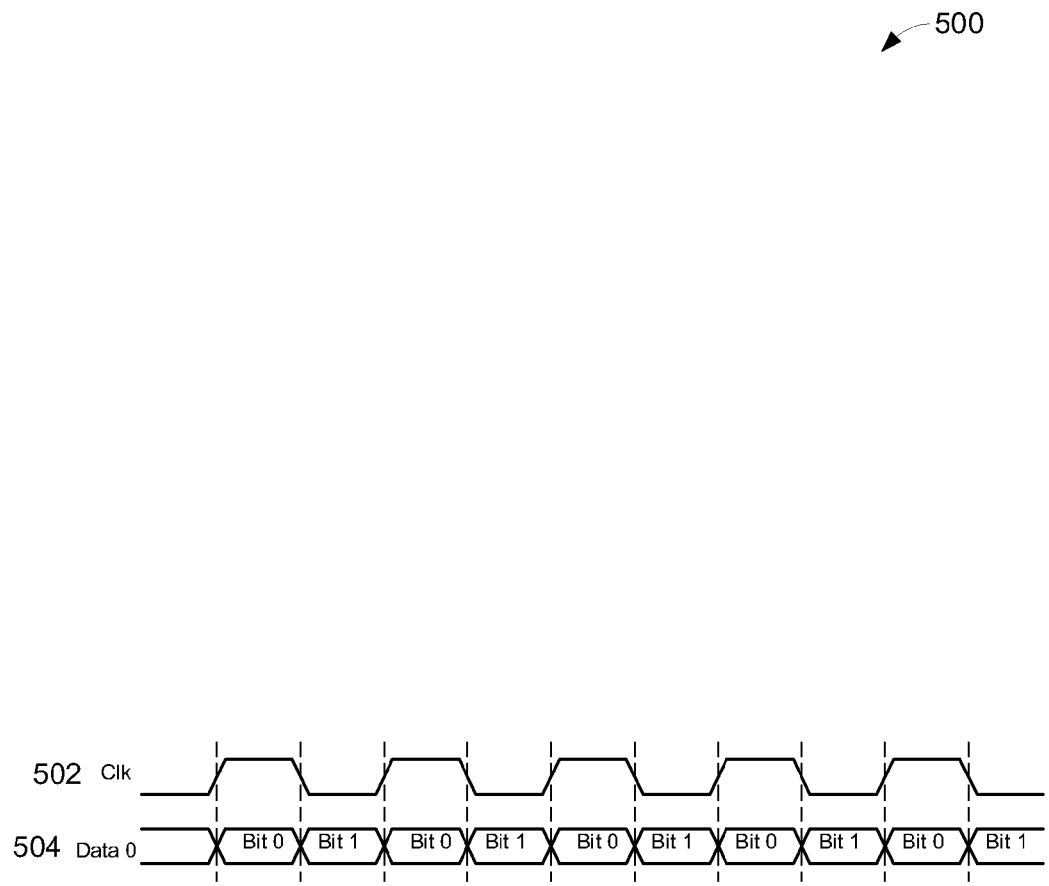
FIG. 5 illustrates example data for edge aligned clocked output where some embodiments of the present invention may be used.
Figure 6:
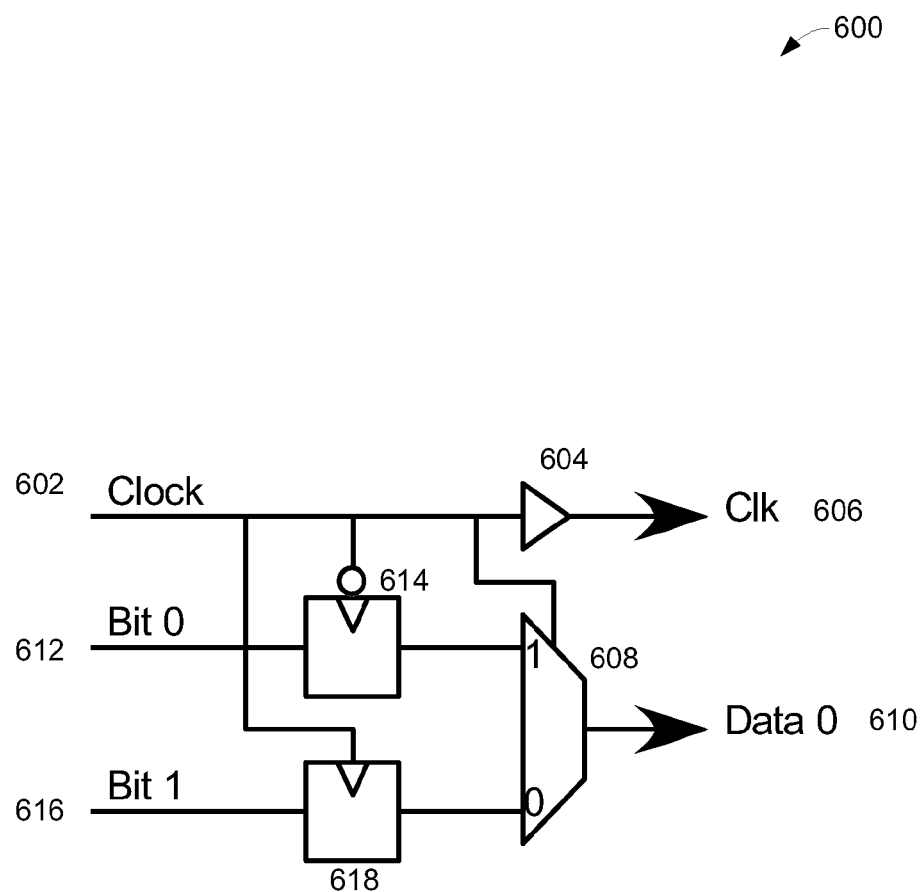
FIG. 6 illustrates an example circuit for edge aligned clocked output where some embodiments of the present invention may be used.

For discussion purposes, the following figures show an example of how a data bus would transfer data. FIG. 4 illustrates an example of a clocked DDR data bus. FIG. 5 illustrates, generally at 500, the relationship between the clock 502 and data 504 on that data bus (only Data 0 (504) shown) where the present invention may be used. FIG. 6 illustrates, generally at 600, an example circuit showing how the clock and data could be generated where the present invention may be used.

Note that in FIG. 5 the clock 502 and data 504 shown are closely aligned. As the clock and data depart the driving circuits and transfer across the transmission medium (e.g. board, cable, backplane, etc.), noise, skew, impedance mismatches and other effects will cause misalignment between the clock and data when they arrive at the receiver. When the receiver attempts to capture the data using the clock, the clock may need to be realigned with the data for accurate data capture.

In one embodiment of the invention, as shown in FIG. 3, the shifting of the clock is accomplished through a serial data chain 302. The chain 302 is in communication with a control function 304. There are two controls 306 and 308 shown that may be used to adjust for example, Phase Detector 310 and/or Frequency Detector 318, and Phase Selected Clock 320 and/or Feedback Clock 314 respectively. That is, one can adjust the phase detector of the PLL to perform a shift in the static phase offset of the signal via control signal 306. One could also set the static phase offset at a value, for example, zero and shift the output signal(s) of the PLL by a programmed amount via control signal 308. Both of these techniques may be accomplished by means of the serial data chain and may be used individually or combined.

The circuit of FIG. 6 demonstrates one method of creating the DDR data output with a source synchronous edge aligned clock of FIG. 5. Upon the rising edge of Clock 602, the signal will be sent through an output buffer 604 and create the signal "Clk" 606. The Clock 602 will also switch the multiplexer 608 and send the previously latched (via register 614) "Bit 0" 612 to the output "Data 0" 610. At the same time, Clock 602 will initiate the latching of Bit 1 616 into the register 618 in preparation for the next half of the clock cycle.

After waiting half a clock cycle, the Clock 602 will make a falling edge transition. The signal will be transferred to the output as "Clk" 606 and Bit 1 (from 616 as latched in 618) will be sent to Data 0 610 aligned with Clk 606. The delay to the output for clock (such as Clock 602 through buffer 604, to Clk 606 in FIG. 6) and Data 0 (such as Data 0 610 from multiplexer 608 in FIG. 6) must be tightly controlled to avoid any skew prior to the signal exiting the driver.

When transitioning at high speeds, the clock and data arrive at the receiver with some skew and distortion, creating uncertainty in the positioning of the clock relative to the data. In some systems, the clock may need to be repositioned in the middle of the data bit for accurate data capture. Current phraseology refers to this as "capturing the data in the middle of the data eye" or similar terminology.

Figure 7:
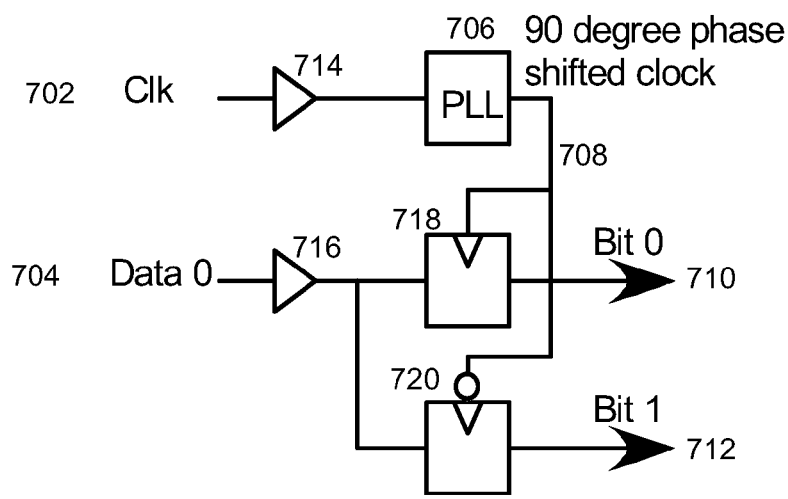
FIG. 7 illustrates an example receiver for capturing edge aligned DDR (double data rate) data where some embodiments of the present invention may be used.

In FIG. 7 is an example, generally at 700, of a receiver that could be used to capture the data generated by the driver circuit of FIG. 6. The clock (Clk 702) and data (only Data 0 shown 704) arrive, ideally in perfect alignment, the clock 702 is delayed 90 degrees (via PLL 706), and the rising edge of the delayed clock 708 then clocks in Bit 0 710, while the falling edge of the delayed clock 708 clocks in Bit 1 712. 714 and 716 are input buffers for Clk 702 and Data 0 respectively, and 718 and 720 are registers.

In cases when the clock (such as Clk 702 in FIG. 7) and data (such as Data 0 704 in FIG. 7) are not in perfect alignment, "training" or a fixed adjustment may be needed so that the clock is more closely aligned for data capture.

The present invention discloses a technique for adjusting the clock position. For example, by using a serial data stream to adjust the clock position. By using a serial data stream, there may be no training required. Training is time consuming, may result in less than optimum positioning, and must be redone whenever there is, for example, a change in devices, or a communication problem over a link. By using the serial data stream method of programming, the clock positioning can be fixed, readjusted as needed, and adapted for changing configurations. The clock position can be updated without requiring retraining and data loss.

Figure 8:
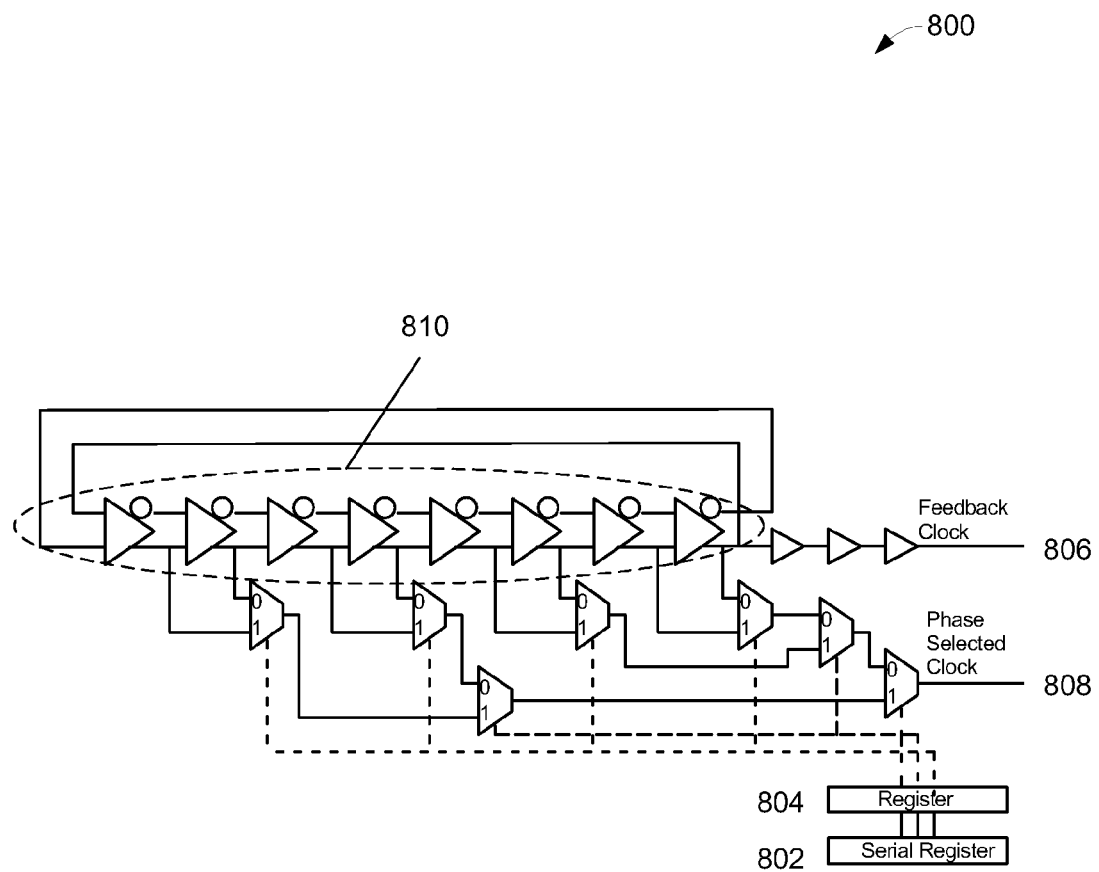
FIG. 8 illustrates one embodiment of the present invention showing a tapped delay line of a PLL.

FIG. 8 shows, generally at 800, one embodiment of the present invention showing a tapped delay line portion of a PLL (e.g. the delay line of FIG. 3). In one embodiment of the invention, al PLL could have any number of gates in its delay line 810. For illustration purposes only we limit the number to eight (in 810) as used in this example for simplicity. When using eight gates, three bits from a serial stream (as received at 802) can select (via register 804) which tap (via the multiplexers—not labeled but showing 0/1 selection) on the delay line 810 will be feed to the output to form the "Phase Selected Clock" 808. In the example, a "000b" would provide a Phase Selected Clock 808 that is identical in phase to the Feedback Clock 806, resulting in a zero static phase offset (under ideal conditions). A "100b" would provide a Phase Selected Clock 808 that is 180 degrees out of phase from the Feedback clock 806. The other values are also available (full range is 000b to 111b).

Figure 9:
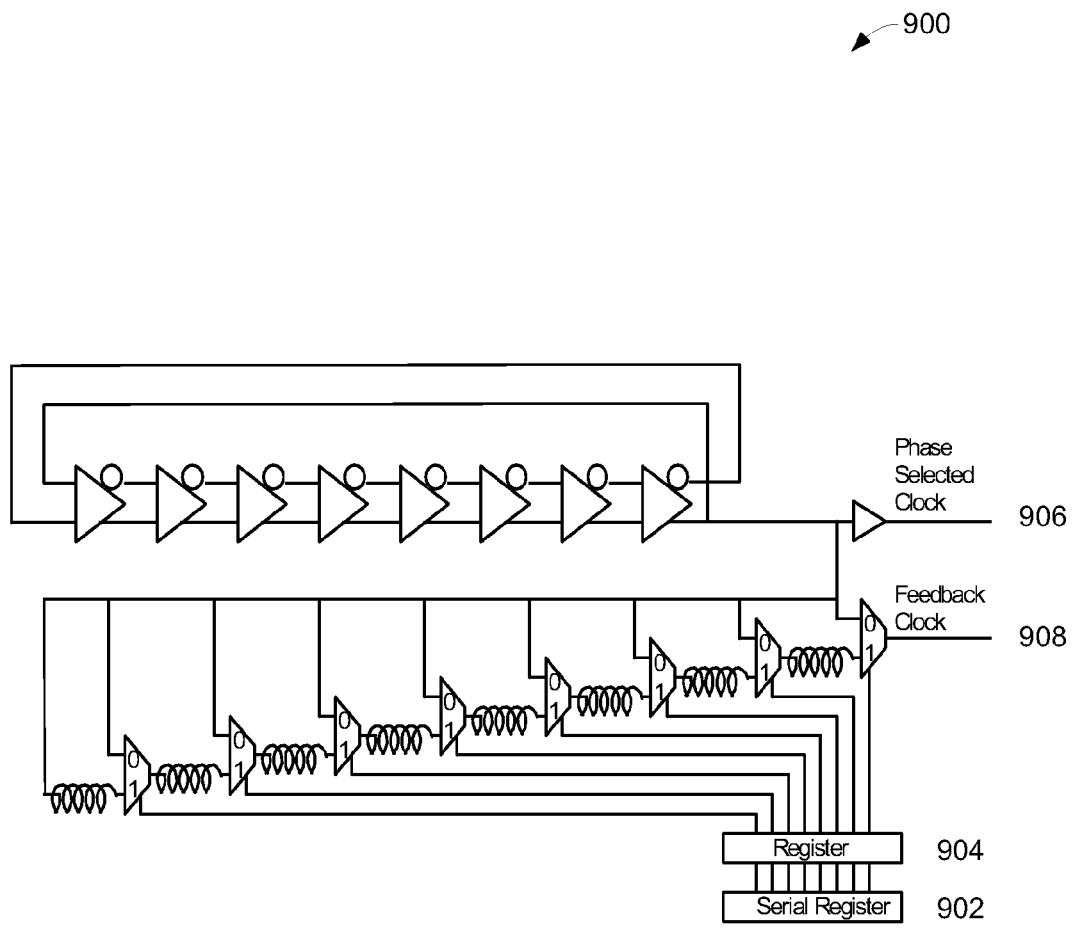
FIG. 9 illustrates one embodiment of the present invention, showing a delay line to produce a delayed feedback clock.

Another embodiment of the invention, showing a technique for performing a phase shift is to delay the Feedback Clock by a programmable amount as shown, generally at 900, in FIG. 9. In this example, entering the code "00000000b" into the register 904 through the serial stream (via serial register 902) will give a Static Phase Offset of zero (ideally). Selecting any other value will provide a delay to the feedback clock 908 by the amount of the multiplexed delay (as selected via the multiplexers—not labeled but showing 0/1 selection). If the feedback is properly sent to the Feedback of a PLL (for example see FIG. 3), the effect will be to advance the Phase Selected Clock 906 relative to the Input (of, for example in FIG. 3). This may be used to provide a programmed early clocking to a circuit.

One of skill in the art will appreciate that if instead of early clocking, the user prefers delayed clocking, the designation of "Phase Selected Clock" and "Feedback Clock" could be reversed, simply delaying the "Phase Selected Clock" by the desired amount.

Figure 10:
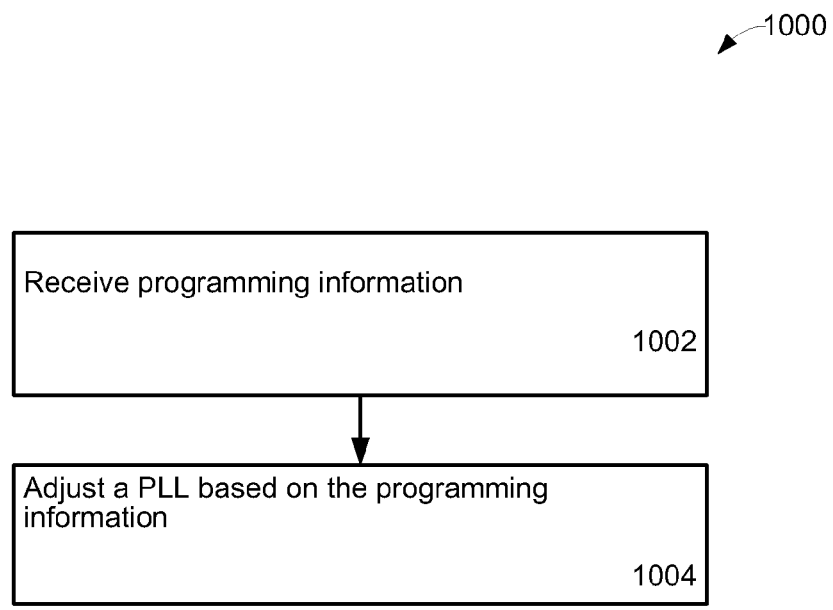
FIG. 10, FIG. 11, FIG. 12, FIG. 13, FIG. 14, FIG. 15, FIG. 16, FIG. 17, FIG. 18, FIG. 19, and FIG. 20 illustrate various embodiments of the present invention.

FIG. 10 illustrates, generally at 1000, one embodiment of the present invention in flow chart form. At 1002 programming information is received. At 1004 a PLL is adjusted based on the programming information.

Figure 11:
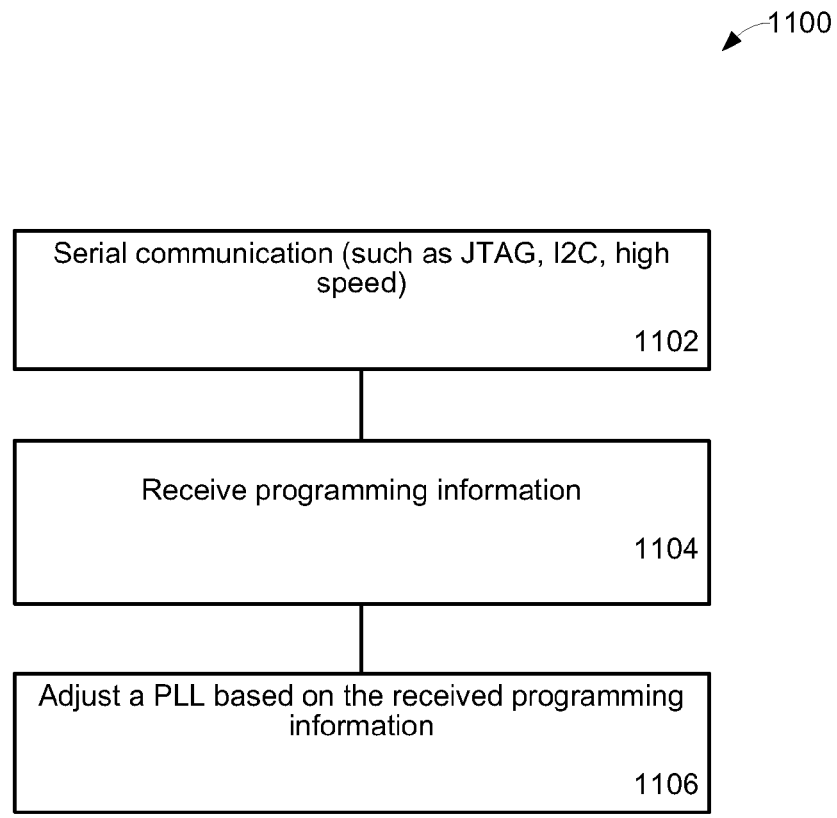

FIG. 11 illustrates, generally at 1100, one embodiment of the present invention in block form. At 1102 is a source of serial communication, at 1104 programming information is received, and at 1106 a PLL is adjusted based on the received programming information.

Figure 12:
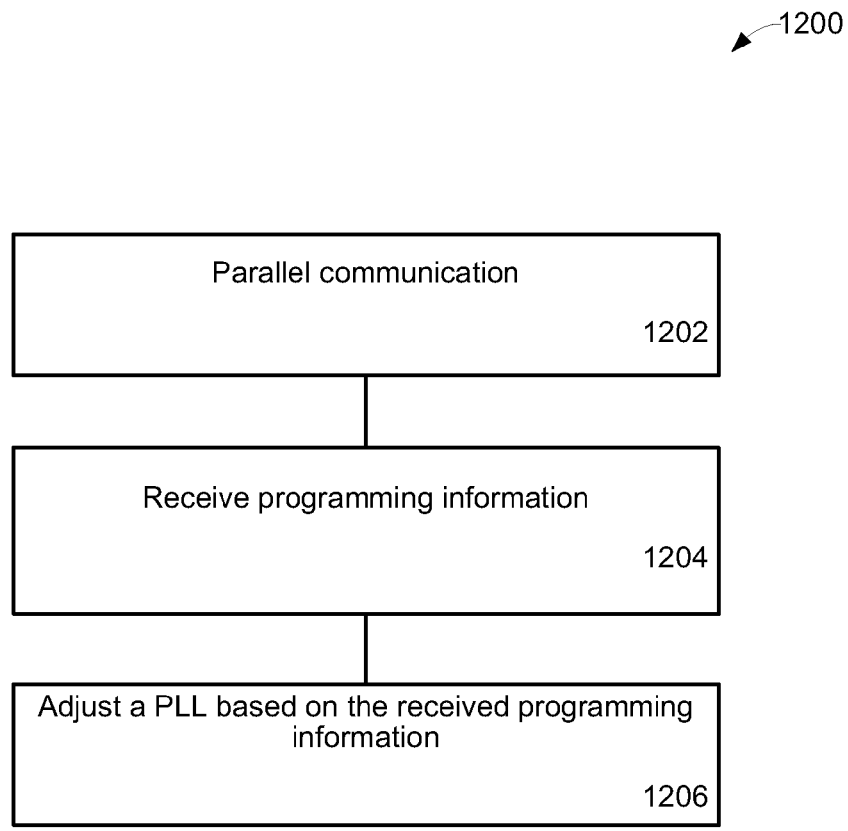

FIG. 12 illustrates, generally at 1200, one embodiment of the present invention in block form. At 1202 is a source of parallel communication, at 1204 programming information is received, and at 1206 a PLL is adjusted based on the received programming information.

Figure 13:
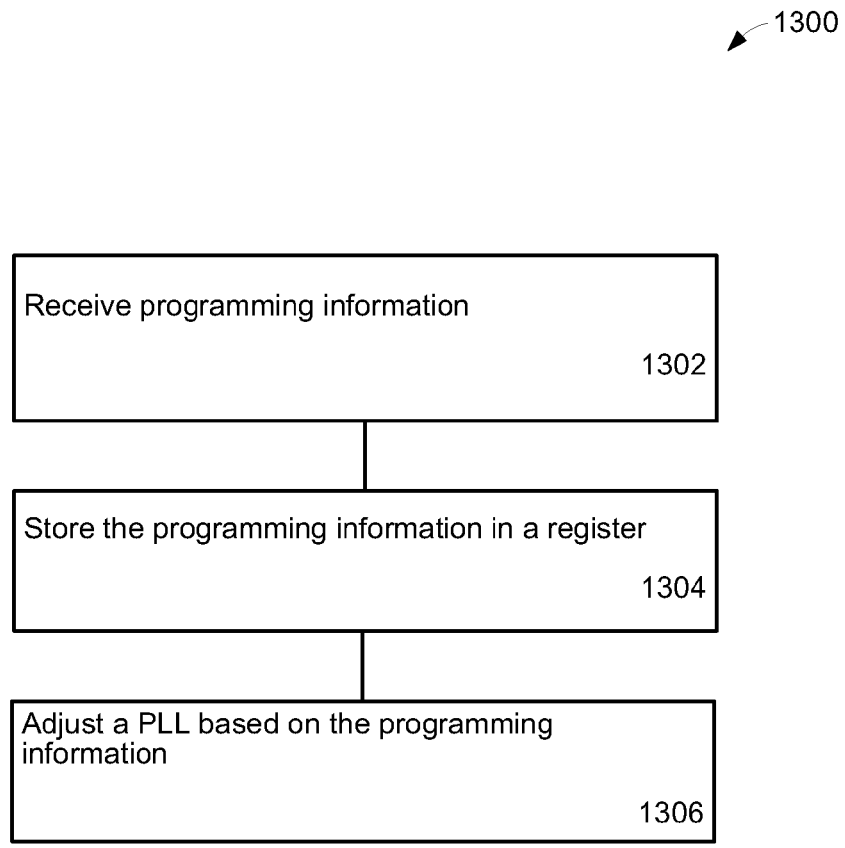

FIG. 13 illustrates, generally at 1300, one embodiment of the present invention in block form. At 1302 programming information is received, at 1304 the programming information is stored in a register, and at 1306 a PLL is adjusted based on the programming information.

Figure 14:
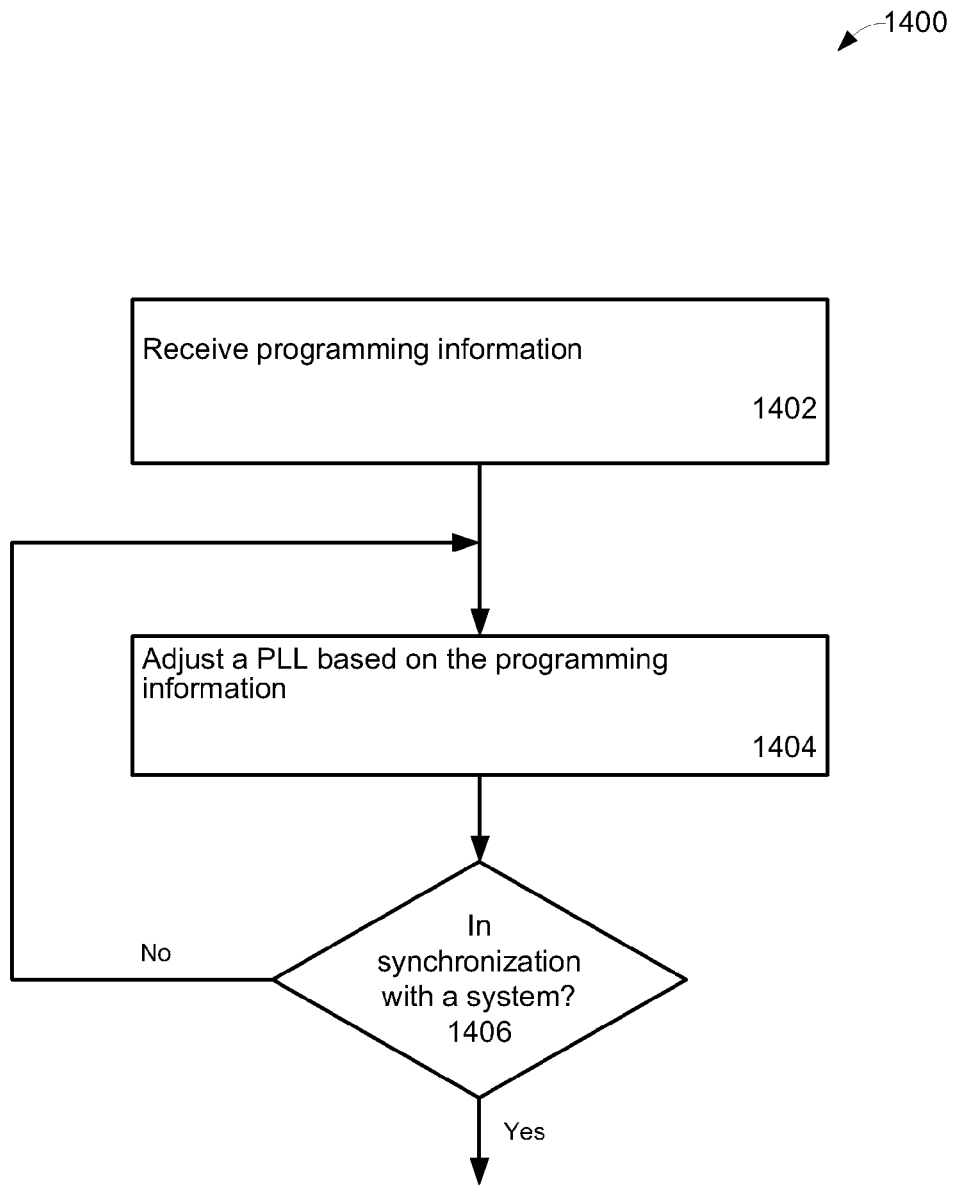

FIG. 14 illustrates, generally at 1400, one embodiment of the present invention in flow chart form. At 1402 programming information is received. At 1404 a PLL is adjusted based on the programming information. At 1406 a check is made to see if the PLL is in synchronization with a system. If it is in synchronization (Yes arrow) then processing may continue doing something else, for example, indicating there is synchronization with the system. If it is not in synchronization (No arrow) then adjustments via block 1404 are made.

Figure 15:
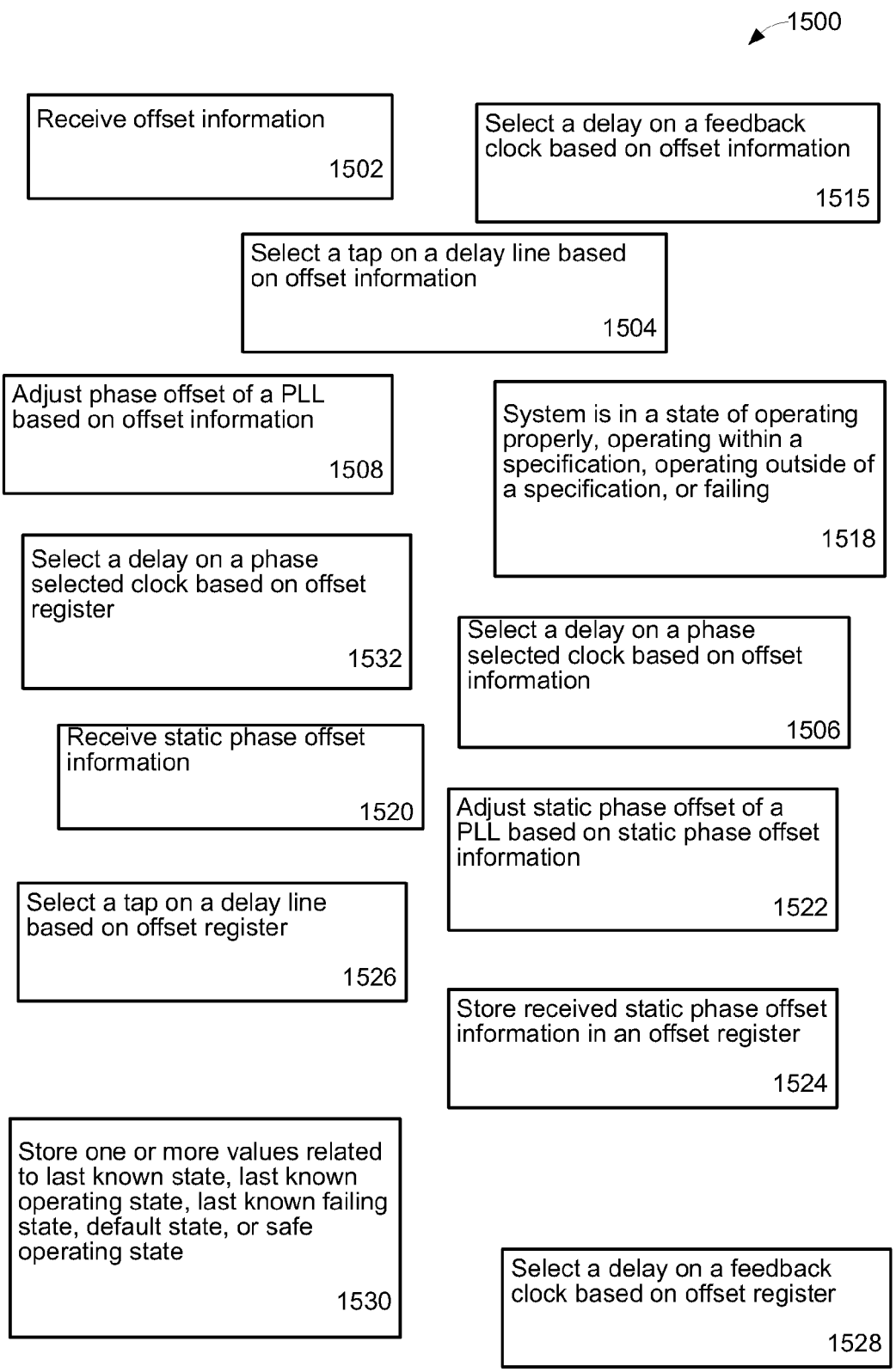

FIG. 15 illustrates, generally at 1500, various embodiments of the present invention in block form. At 1502 offset information is received. At 1508 the phase offset of a PLL is adjusted based on offset information. At 1504 a tap on a delay line is selected based on offset information. At 1515 a delay on a feedback clock is selected based on offset information. At 1506 a delay on a phase selected clock is selected based on offset information. At 1518 a system is in a state of operating properly, operating within a specification, operating outside of a specification, or failing. At 1528 a delay on a feedback clock is selected based on an offset register. At 1520 information on static phase offset is received. At 1532 a delay is selected on a phase selected clock based on an offset register. At 1522 static phase offset of a PLL is adjusted based on static phase offset information. At 1530 one or more values related to last known state, last known operating state, last known failing state, default state, or safe operating state are stored. At 1524 received static phase offset information is stored in an offset register.

Figure 16:
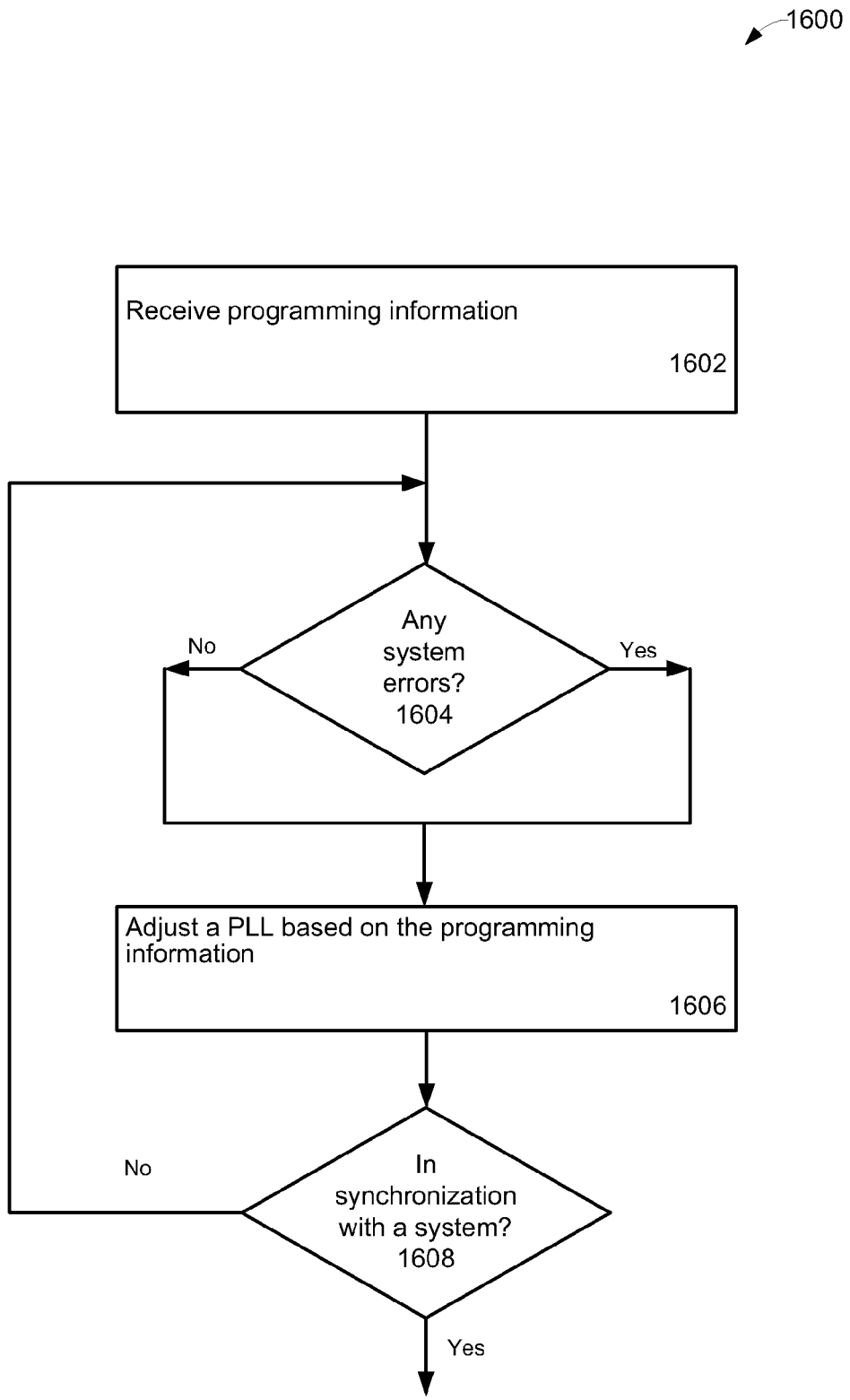

FIG. 16 illustrates, generally at 1600, one embodiment of the present invention in flow chart form. At 1602 programming information is received. At 1604 a check is made to see if there are any system errors. In this embodiment, whether there are system errors or not, at 1606 a PLL is adjusted based on the programming information. At 1608 a check is made to see if the PLL is in synchronization with a system. If it is in synchronization (Yes arrow) then processing may continue doing something else, for example, indicating there is synchronization with the system. If it is not in synchronization (No arrow) then adjustments via block 1606 are made, again regardless of any system errors at 1604.

One of skill in the art will appreciate that not only is adjustment possible as described, for example above, but the ability to read back and/or store the current adjustment. Thus, for example, the values associated with an operating system may be stored prior to shutdown and may be restored when the system is again powered up. Storing a last known operating state, and for example, a default state may be very useful. In the event a system, for whatever reason, does not operate properly when reloaded with last known values it may revert back to a default state. On the other hand, if the system is being adjusted and fails to operate properly the settings may be reset to the last known operating state.

So, for example, using this methodology a system has the ability to restore the last known state. This can be done serially by either reading the last known state before shutdown or remembering the last programmed state. Upon restart, the last known state can be serially restored.

Additionally, one of skill in the art will appreciate that the techniques disclosed may be used for calibration. For example, a PLL may be adjusted to a certain specification at the time of manufacture or testing and this adjustment value may be, for example, stored within the PLL using, for example, flash memory.

Figure 17:
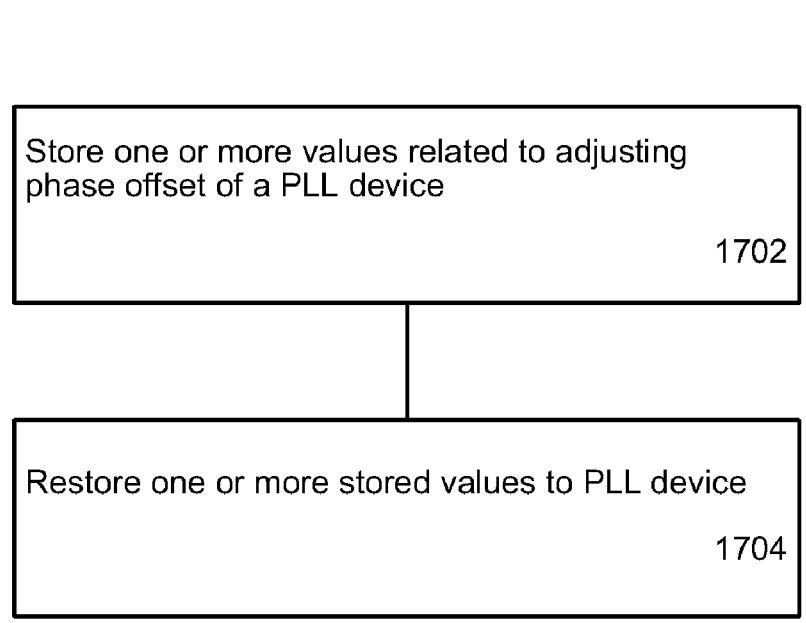

FIG. 17 illustrates, generally at 1700, one embodiment of the present invention. At 1702 one or more values related to adjusting phase offset of a PLL device are stored. At 1704 one or more stored values are restored (e.g. reloaded into) to the PLL device.

Figure 18:
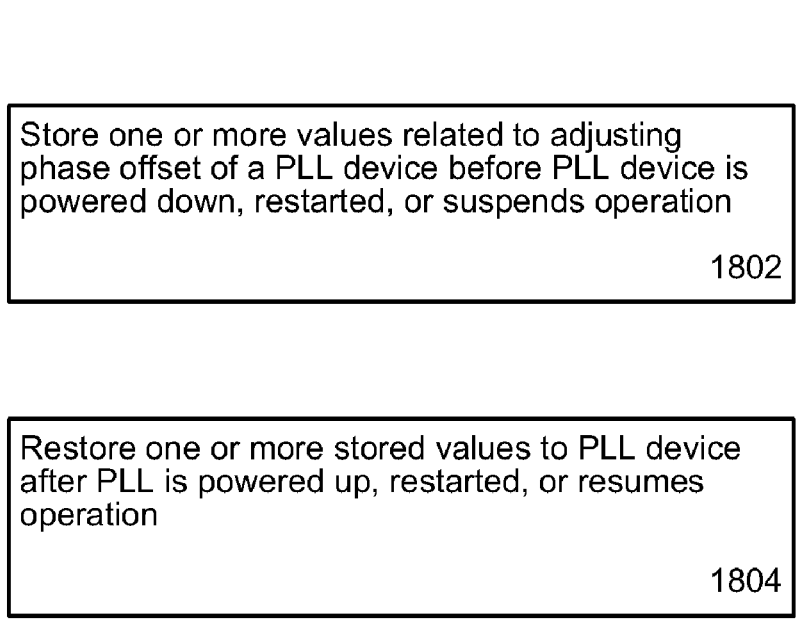

FIG. 18 illustrates, generally at 1800, one embodiment of the present invention. At 1802 are stored one or more values related to adjusting phase offset of a PLL device before the PLL device is powered down, restarted, or suspends operation. At 1804 one or more stored values are restored to the PLL device after the PLL is powered up, restarted, or resumes operation.

Figure 19:
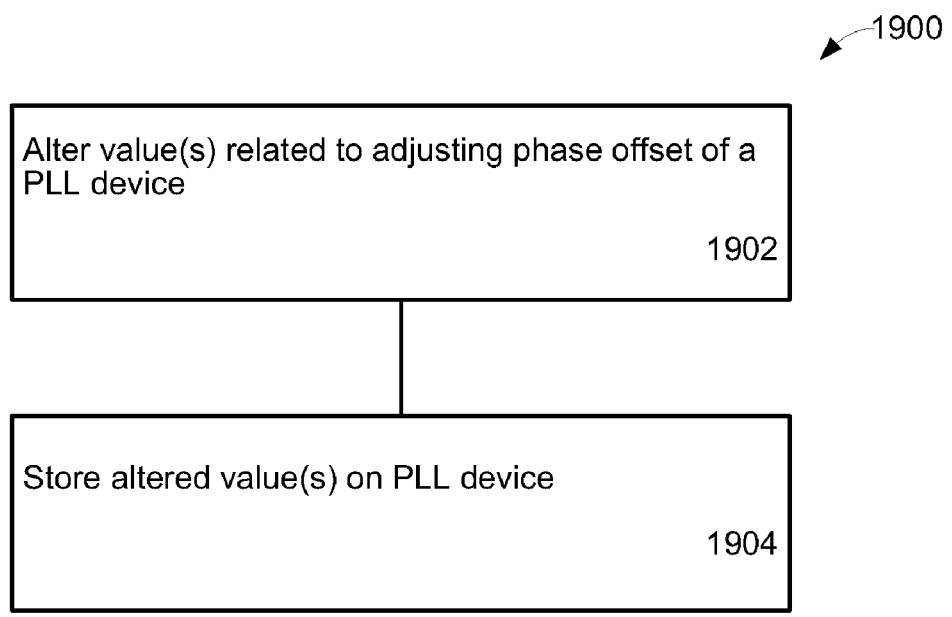

FIG. 19 illustrates, generally at 1900, one embodiment of the present invention. At 1902 value(s) are adjusted or altered related to adjusting phase offset of a PLL device. At 1904 the value(s) are stored on the PLL device.

Figure 20:
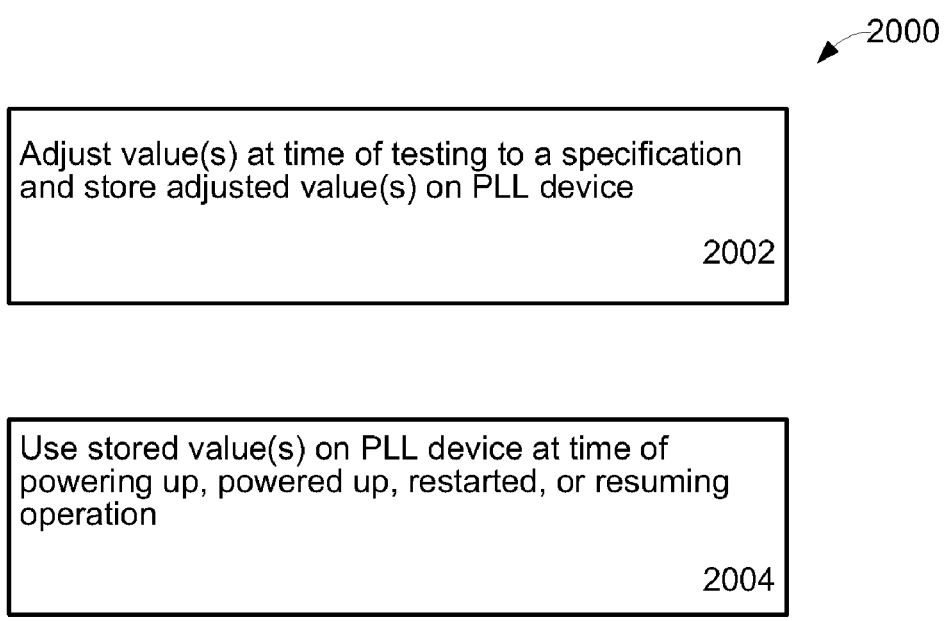

FIG. 20 illustrates, generally at 2000, one embodiment of the present invention. At 2002 value(s) are adjusted at the time of test (e.g. during manufacture) to a specification and the adjusted value(s) are stored on the PLL device The method and apparatus of the present invention, as disclosed may be used on a variety of lock loop devices. Additionally, the present invention may be used with analog and digital versions of lock loop devices. For example, analog PLL, digital PLL, analog FLL (frequency locked loop), etc.

Thus a method and apparatus for adjusting PLL and/or DLL timing offsets have been described.

Figure 1:
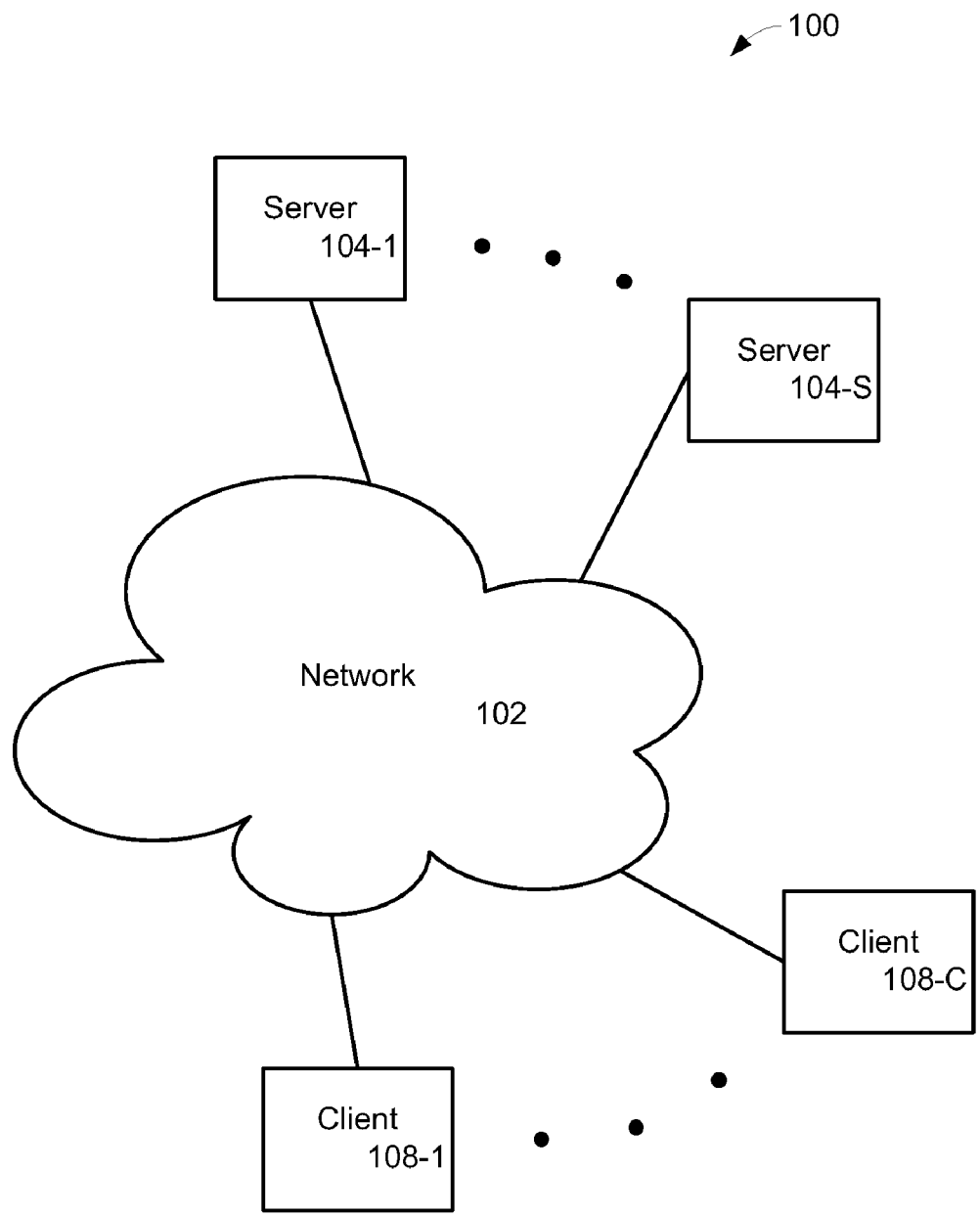
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
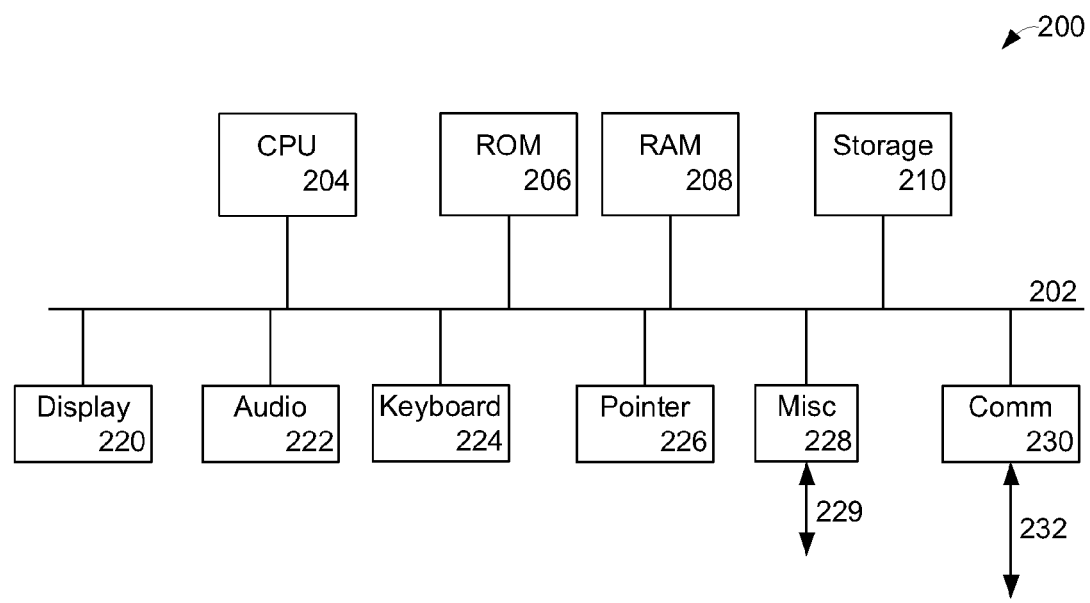
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to any type of electronic device. Thus, for example, the invention may find application at both the S servers 104-1 through 104-S, and C clients 108-1 through 108-C.

Further the method and apparatus described herein may be available and/or capabilities based on a variety of criteria. For example, certain features may be based upon communication of a payment and/or credit.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those of skill in the art to describe techniques and approaches. Furthermore, in the description, for purposes of explanation, numerous specific details are set forth in order to provide a thorough understanding of the present invention. It will be evident, however, to one of skill in the art that the present invention may be practiced without these specific details. In some instances, well-known structures and devices are shown in block diagram form, rather than in detail, in order to avoid obscuring the present invention. These embodiments are described in sufficient detail to enable those of skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory, and/or logic circuitry. These algorithmic descriptions and representations are the means used by those of skill in the arts to most effectively convey the substance of their work to others of skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

Further, any of the methods according to the present invention can be implemented in hard-wired circuitry, by programmable logic, or by any combination of hardware and software.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.) capable of affecting a physical entity (e.g. movement) upon absorption and/or reflection of such; etc.

Embodiments of the present invention produce a useful, concrete, and tangible result, for example, but not limited to, a physical transformation in a memory or other storage device, a real world display of results to a user, etc. For example, one or more embodiments of the present invention alter the contents of memory registers which may be in the form of a physical electrical charge on a gate resulting from the tangible number of electrons and the contents of the memory register may be presented to a user in a real world display, such as, but not limited to, a screen, etc.

As used in this description, "static phase offset" or similar phrases are understood by one of skill in the art to refer to offsets in phase that can be related to timing offsets and vice versa. Various definitions exist, for example, static phase offset is defined by JEDEC (Joint Electron Device Engineering Council) in document JESD65 as the following: static phase offset ($t_{(\phi)}$): The time interval between similar points on the waveforms of the averaged input reference clock and the averaged feedback input signal when the PLL is locked and the input reference frequency is stable.

One of skill in the art understands various terms that are associated with locked loop circuits such as phase offset, capture range, tracking range, timing delay, phase shift, frequency shift, drift, dead band, phase detector, VCO (voltage controlled oscillator), comparator, low pass filter, charge pump, lock, etc. For example, one of skill in the art understands that when "lock" is achieved there is a fixed relationship between the output signal and the input signal, for example, in a PLL. This is also understood by one of skill in the art as achieving "sync" (i.e. synchronization). That is, the output signal and the input signal are in a fixed relationship to each other. Synchronization within a system is understood as achieving a fixed relationship between two or more signals of interest. For example, a system may be in synchronization when a clock chip output has a fixed relationship to another signal, for example, data from a memory, etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus a method and apparatus for adjusting PLL and/or DLL timing offsets have been described.

What is claimed is:

1. An apparatus comprising:
    means for receiving information from a source other than a phase lock loop (PLL) output and a PLL phase detector input;
    means for adjusting offset of a PLL device based on said information;
    means for receiving information via JTAG;
    means for storing said received information in a register;
    means for selecting a tap on a delay line based on said register;
    means for selecting a delay on a feedback clock based on said register; and
    means for selecting a delay on a phase selected clock based on said register.

2. The apparatus of claim 1 further comprising:
    means for storing said received information from said source other than said PLL output and said PLL phase detector input; and
    means for restoring said stored received information, wherein said stored received information is selected from the group consisting of last known state, last known operating state, last known failing state, a default state, and a safe operating state.

3. The apparatus of claim 2 wherein said means for storing said received information is performed before said PLL device enters a state selected from the group consisting of powered down, restarted, and suspended.

4. The apparatus of claim 2 wherein said means for restoring said received information is performed after said PLL device enters a state selected from the group consisting of powered up, restarted, and resuming operation.

* * * * *